United States Patent [19]

Jeschke et al.

[11] 4,448,533
[45] May 15, 1984

[54] APPARATUS FOR ENSURING THE QUALITY OF PRINTED PRODUCTS

[75] Inventors: Willi Jeschke, Heidelberg; Hugo Rambausek, Wiesloch; Rudolf-Karl Uhrig, Schriesheim; Gerhard Löffler, Weisenheim, all of Fed. Rep. of Germany

[73] Assignee: Heidelberger Druckmaschinen, Heidelberg, Fed. Rep. of Germany

[21] Appl. No.: 358,380

[22] Filed: Mar. 15, 1982

Related U.S. Application Data

[63] Continuation of Ser. No. 117,475, Feb. 1, 1980, abandoned, which is a continuation of Ser. No. 915,762, Jun. 15, 1978, abandoned.

[30] Foreign Application Priority Data

Jun. 16, 1977 [DE] Fed. Rep. of Germany ....... 2727227

[51] Int. Cl.³ .......................... G01J 3/48; G01N 21/55
[52] U.S. Cl. ...................................... 356/416; 356/445
[58] Field of Search ............... 356/402, 405, 406, 416, 356/419, 445, 407; 250/226

[56] References Cited

U.S. PATENT DOCUMENTS 4,003,660 1/1977 Christie .......................... 356/416 X Primary Examiner—John K. Corbin
Assistant Examiner—Rodney B. Bovernick
Attorney, Agent, or Firm—Herbert L. Lerner

[57] ABSTRACT

Monitoring device for densitometrically evaluating printed sheets with a printed print-monitoring strip includes holding means, a plurality of first densitometers for exclusively measuring full-tone density carried by the holding means at a selective spacing from one another so as to define respective gaps between the first densitometers, and a plurality of second densitometers for measuring at least one tone density value selected from a range of screen and full tone values, the second densitometers being receivable, respectively, in the gaps between the first densitometers and being connectible to a device for mathematically correlating the values measured by the second densitometers with quality-assessing parameters.

6 Claims, 4 Drawing Figures

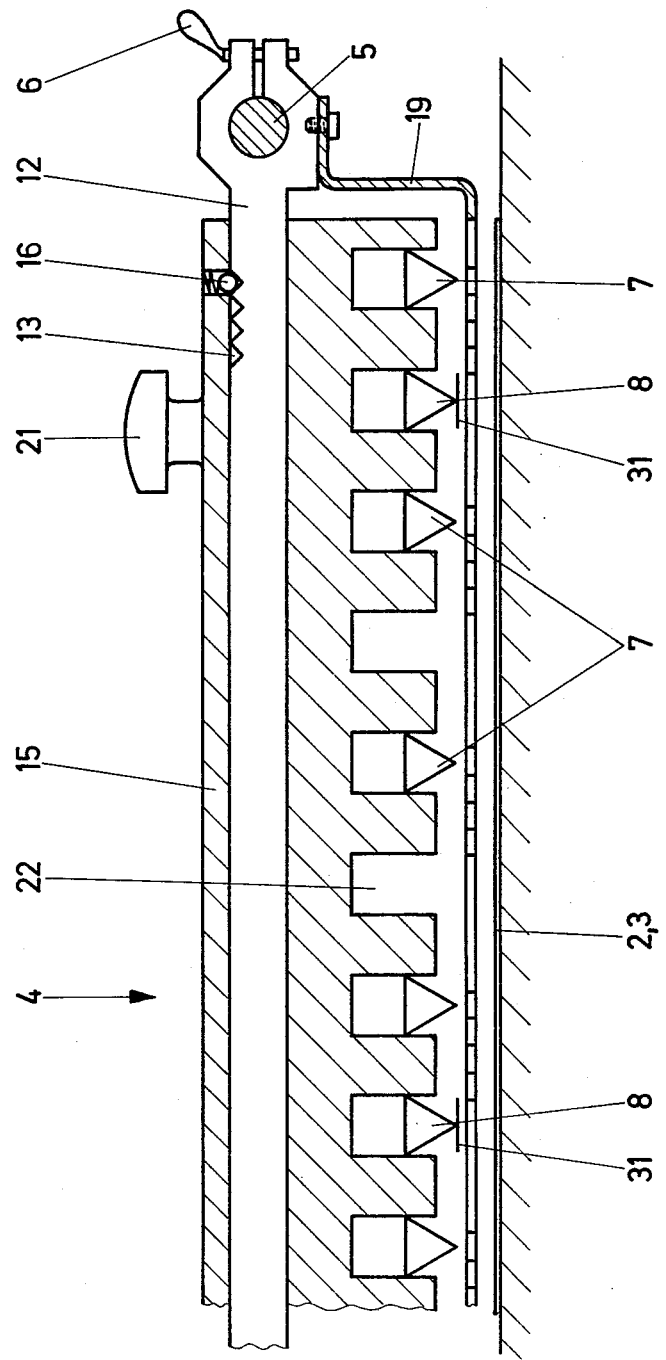

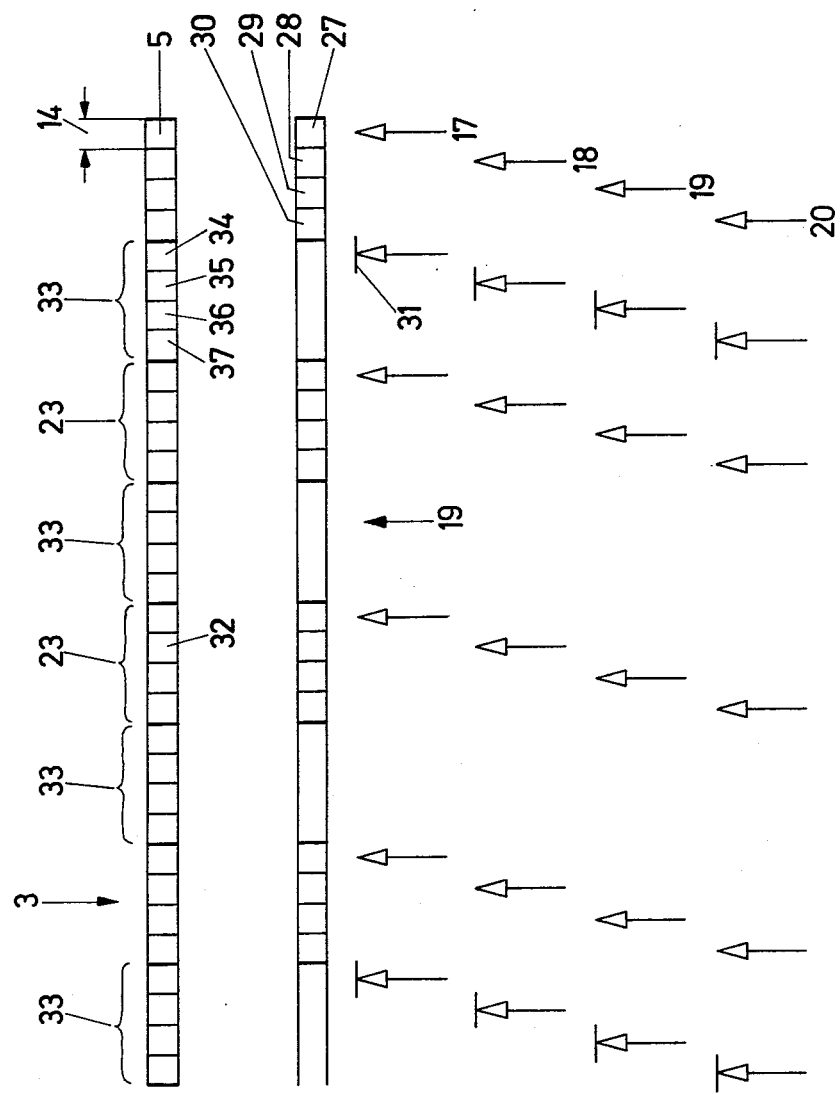
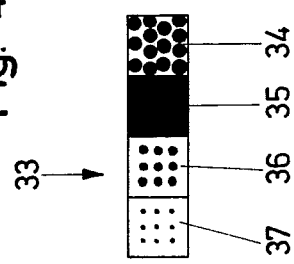

APPARATUS FOR ENSURING THE QUALITY OF PRINTED PRODUCTS

This is a continuation of application Ser. No. 117,475 filed Feb. 1, 1980, which is a continuation application of Ser. No. 915,762, filed June 15, 1978 abandoned.

The invention relates to apparatus for ensuring the quality of printed products. In many instances, a printer's value judgement is no longer adequate for evaluating the quality of printed work, especially with respect to the reproduction of color pictures.

Only by the introduction of measurable quantities or values, and the correlation of several of those individually measured values in mathematically formulatable relationships, is an objective evaluation able to be effected. By prescribing agreed tolerances, differences of opinion between printers, reproducers and fly hands can be avoided and, also, the printing process can be practical with optimal economy.

Numerous methods of metrological quality evaluation exist. Those methods which employ for evaluating a printed sheets, so-called print-monitoring or test strips, which are printed simultaneously with the printed sheet outside the image surface per se (such as e.g. the conventional test strips of FOGRA, GATF, UGRA, BRUNNER and the like), have found to approximate actual or practical conditions and to be thoroughly satisfactory. The strips generally contain test fields for full tone density, point screens for different degrees or tones of surface cover, and also line screens and often also full surface test fields for metrological detection of color intensification in the superimposed printing of consecutive colors. The optical densities of the individual test fields are tested or measured by means of densitometers and, if desired, are brought into relationship with one another. The evaluation is generally effected by recourse to tables, slide rules, nomograms or other calculating aids. Pre-programmed pocket calculators are also used for this purpose.

A disadvantage of these heretofore known methods is that test field after test field of the control strip, or also of a plurality of control strips disposed or arranged consecutively in the direction of travel of the sheet, must be tested individually i.e. in chronological sequence, field by field. In addition, a changeover of the color filters of the densitometers must be effected for each test field color. The test values must be recorded. Even when making use of a calculating aid, the evaluation work is time consuming and strenuous, and errors may be made. In particular, continuous supervision of printing progress demands skill and powers of concentration on the part of the evaluator. It is, in fact, obvious, and presumably also known heretofore, to accommodate a plurality of densitometers adjacent and laterally offset from one another in a common bracket or holder in order to reduce the number of test operations. However, no especially advantageous arrangement or disposition of the densitometers in order to achieve maximum information results for only a few test or measurement operations has become known heretofore.

It is accordingly an object of the invention to provide apparatus for ensuring the quality of printed products or with which, especially for multicolor printing, as comprehensive information as possible regarding the quality of the printed sheet to be evaluated is obtained with only one rapidly performed test or measurement operation, the cost outlay for the apparatus being in an economical relationship to that for the entire printing machine installation, the necessary print-monitoring strip occupying no greater a surface area on the printed sheet than hitherto i.e. that a single, narrow monitoring strip extending across the sheet width of the four-color printed sheet affords an economical utilization of the printed material.

An initial contribution to achieving the objective according to the invention is attributable to the realization that two categories of information from test values are to be distinguished.

Deviations of the test results from prescribed values of the full tone density are generally corrected by modifying the ink quantity to be supplied to the printed sheet. This involves ink-quantity modifications which must either be effective across the entire sheet width, or such modifications which are necessary only in specific, selected zones. From this, there follows the requirement that the full tone densities be detectable in test fields distributed as uniformly as possible across the sheet width. Only in this way is it possible, with the recognition of all the full tone densities of the tested zones, to issue the appropriate correction command, whether it be a modification of the entire ink supply e.g. by modifying the ink stripe width on the doctor or a modification of the ink supply in the zone deviating from the prescribed density value by modifying the position of the zone adjusting screw, respectively, at the printing unit of the relevant color.

Whereas the full tone density, for the foregoing reason, can often be detected in every color, this is not the case for the second category of information. This category is understood to embrace information about the printing contrast, the increase in screen or half-tone points and the occurrence of shifting and doubling i.e. those values which are formed by a mathematical correlation of full tone and/or screen tone values. If the test fields for the individual information components of the parameter to be formed by the relationships are disposed closely adjacent one another in the monitoring strip, then even when the full-tone density deviates across the sheet width, the final values of the deviations formed by correlation will be largely independent.

With the foregoing and other objects in view, there is provided in accordance with the invention, a monitoring device for densitometrically evaluating printed sheets with a printed print-monitoring strip comprising holding means, a plurality of first densitometers for exclusively measuring full-tone density carried by the holding means at a selective spacing from one another so as to define respective gaps between the first densitometers, and a plurality of second densitometers for measuring at least one tone density value selected from a range of screen and full tone values, or, in other words, full tone and/or screen tone value, the second densitometers being receivable, respectively, in the gaps between the first densitometers and being connectible to a device for mathematically correlating the values measured by the second densitometers with quality-assessing parameters.

In accordance with another feature of the invention, there is provided a print-monitoring strip underlying the holding means and having a plurality of test fields of given width consecutively disposed thereon, the holding means together with the first and second densitometers being axially slidable into a plurality of test positions corresponding to the widths of the test fields with respectively equal spacing between the test positions.

In accordance with a further feature of the invention, the test positions into which the holding means together with the first and second densitometers are slidable are four in number corresponding to the four colors of a four-color printing process. Due to the lateral displacement of the bracket or holding means into, for example, four positions (three displacements from the basic or initial position), the densitometers for the exclusive full-tone density measurement, which are preferably distributed uniformly across the sheet width, can be brought consecutively opposite the full tone surface for the four colors arranged in the monitoring strip, while the densitometers for measuring the full tone and/or screen tone values, which are necessary for mathematical correlation to form quality-evaluating parameters in one color, consecutively detect the test surfaces (screens of varying surface cover, full tone surfaces and the like), required for the correlation of the respective color.

In accordance with an added feature of the invention, a stationary color filter bar is associated with and located opposite all of the plurality of first densitometers for exclusively measuring full-tone density, the color filter bar being free of any filters in regions thereof juxtaposed to the gaps between the first densitometers.

In accordance with an additional feature of the invention, additional color filters respectively associated with each of said second densitometers i.e. those that test the full tone and/or screen tone values necessary for mathematical correlation to yield quality evaluating parameters. Such an arrangement permits the stationary filter bar to be constructed without filters in the region of the gaps, so that greater freedom is provided in the formation of the print monitoring strip.

In the case of the arrangement of, for example, only densitometers for testing the full tone and/or screen tone values necessary for mathematical correlation, the filter of which differ from one another, the values to be formed by the mathematical correlation can be obtained in the same test operation as that necessary for detecting the full tone values in the four colors.

In order to permit freely selective placement of the test strip in the printed image, in accordance with a concomitant feature of the invention, the monitoring device includes guide means, the holding means together with the first and second densitometers being mounted conjointly with the color filter bar and being displaceable therewith as a unit in the guide means and parallel to the leading edge of a printed sheet, and means are also provided for releasably fixing the holding means with respect to the guide means.

Other features which are considered as characteristic for the invention are set forth in the appended claims.

Although the invention is illustrated and decribed herein as embodied in apparatus for ensuring the quality of printed products, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings in which:

FIG. 2 is an enlarged fragmentary view of FIG. 1 showing a diagrammatic, highly simplified vertical sectional view of a bracket or holder for one possible densitometer arrangement;

FIG. 3 is a schematic view showing densitometers in association with test strips and a color filter bar for one possible densitometer arrangement; and FIG. 4 is a greatly enlarged view of part of the print-monitoring strip of FIG. 3.

Figure 1:
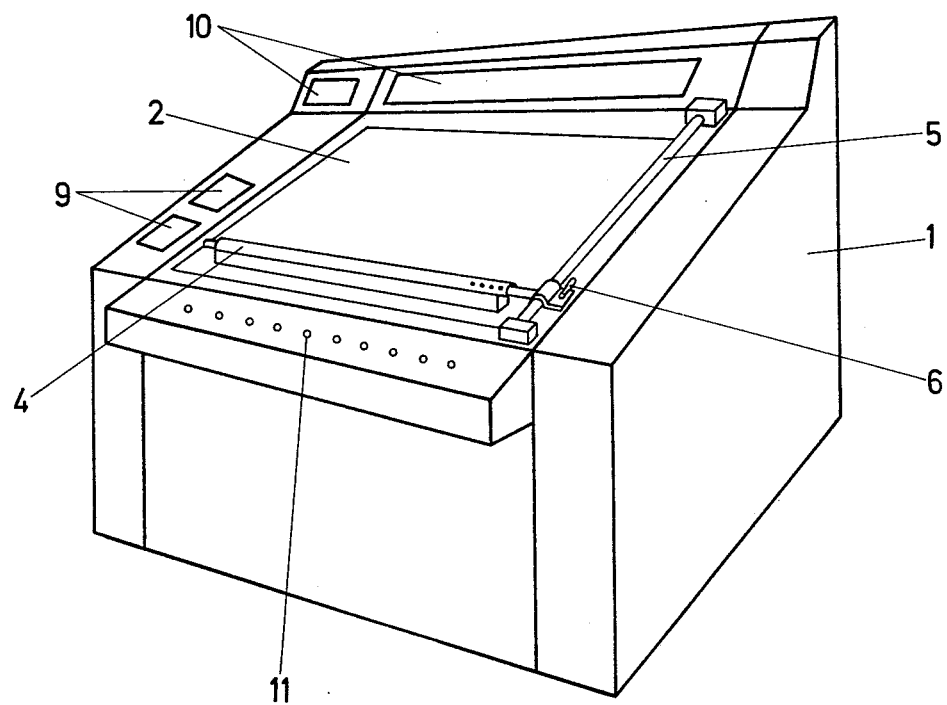
FIG. 1 is an overall perspective view of a test installation or apparatus for ensuring the quality of printed products according to the invention.

Referring now to the drawing and first, particularly, to FIGS. 1 and 2 thereof, there is shown a sheet 2 for evaluation having a printed print-monitoring strip 3 (note FIGS. 2 and 3) disposed on a test bench 1.

A bracket or holder 4, hereinafter referred to as a test beam, is disposed above the print-monitoring strip 3 on the sheet 2; in FIG. 1, the print-monitoring strip 3 is masked or covered by the test beam 4. The test beam 4 is slidable along a guide bar 5 and is lockable on the latter in any desired position by means of a suitable clamping device 6. The test bench 1 contains a non-illustrated conventional electronic evaluator device which is connected to diagrammatically illustrated conventional densitometers 7 and 8 by non-illustrated wires. Operating elements 9 and displays 10 permit the evaluation of test results; operating elements 11 permit the adjustment of adjusting members for the ink supply in the printing machine.

The test beam 4 is equipped with a guide bar 12 which is provided with four catches or notches 13, the mutual spacing of which corresponds approximately to a test field division 14 (FIG. 3) on the print-monitoring strip 3. A test-head receiver housing 15 slidable on the guide bar 5 has a ball catch 16, by means of which the test-head receiver housing 15 can be retained in four prescribed test positions represented diagrammatically by arrows at 17, 18, 19 and 20, in FIG. 3. The test-head receiver housing 15 can be slid into the respective test positions 17 to 20 by means of a handle 21. The receiver housing has receiving chambers 22 wherein the hereinaforementioned densitometers 7 and 8 are received, the densitometers 7 and 8 being so disposed as to be removable for the purpose of maintenance and, if desired, for being repositioned in other receiving chambers 22 of the test-head receiver housing 15. Each spacing interval or division for the receiving chambers 22 corresponds approximately to four test field divisions 14, or is somewhat greater than the latter, if gaps are left in the print-monitoring strip 3 between the individual test field blocks 23 and 33.

The division of the spacings for the test head receiving chambers 22 preferably corresponds to a zone division of the non-illustrated conventional ink adjusting means, through which an association of the test to the adjusting location on the machine is provided.

A color filter bar 39 is secured to the guide bar 12 and, therefore, does not participate in the displacement of the test head receiver housing 15 relative to the guide bar 12. The position of the color filter bar 39 with reference to the printed sheet accordingly remains unchanged throughout the test operations.

The densitometers 7 serve exclusively for full tone testing of all four colors. They are inserted into every second one of the receiving chambers 22 and are disposed opposite the color filters 27 in the test position 17, with the test-head receiver housing 15 locked in the extreme right-hand notch (note FIG. 2). In the test position wherein the test-head receiver housing 15 is locked in the second notch from the right-hand side, as viewed in FIG. 2, the densitometers 7 are located opposite the filters 28, in the test position 19, with the test-head receiver housing 15 in the third notch from the right-hand side, opposite the filters 21, and in the test position 20, opposite the filters 30, when the test-head receiver housing 15 is locked in the fourth notch from the right-hand side, as viewed in FIG. 2.

In FIG. 3, the color filters 27 are of the color red, the color filters 28 of the color green and the color filters 29 of the color blue. Also shown is a brightness filter 30.

The respective printing colors (cyanide) blue, (magenta) red, yellow and black, on the print-monitoring strip 3 are associated with the various color filters 27 to 29, as well as with the brightness filter 30.

the densitometers 8 have their own built-in color filter 31. In FIG. 3, for example, the filter 31 is a red color filter and is used for testing in a test field block 33 of the monitoring strip in the color cyanide (blue).

Whereas the test field blocks 23 contain, in consecutive order, the test surfaces 32 for the full tone densities in the color cyanide (blue), magenta (red), yellow and black, the test field blocks 33 serially or consecutively exhibit a test field 34 with a surface cover of 80% (with respect to the autoscreen film, and thus not with respect to the actual state), a full tone surface 35, a test field 36 with 39% surface cover in the film, and a test field 27 with 7% surface cover in the film. Such a test field block 33 is shown greatly enlarged in FIG. 4.

When tested consecutively, the test fields 34 to 37 of the test field blocks 33 yield, for example, print contrasts for the three screens in accordance with the known equation $$K = \frac{D_V - D_R}{D_V},$$

wherein K=contrast, $D_y$=full tone density and $D_R$=screen tone density in the print.

By comparing the theoretical surface cover in the film with the optically effective surface cover in the print, which is likewise calculated from known relationships, the screen dot increase for the surface covers of 7%, 39% and 80% can be ascertained, which is generally accomplished in conventional electronic evaluating systems, which detect all the test values, store them, perform the appropriate mathematical correlation for the values obtained through the densitometers 8, and hold them in readiness for indication in the display 10, when summoned. Thereby, for example, the transmission characteristic is known sufficiently accurately as a measure of the quality of the printing process.

The same test or measurement is performed simultaneously for the other colors in the remaining test field blocks 33.

For a sheet approximately one meter wide, thirty-two zones, for example, have to be adjusted on the non-illustrated ink duct or fountain of the printing machine. The test beam 4 then has thirty-two receiving chambers 22, into every second chamber of which, for example, a densitometer 7 for full-tone density measurement may be inserted, thus sixteen densitometers 7 in all. The densitometers 7 afford the detection of the full tone density across the entire sheet width. Four additional densitometers 8, which are inserted into any of the receiving chambers 22 left unoccupied between the densitometers 7, yield quality statements in the four colors, depending upon the conformation of the print-monitoring strip 3 through contrast, dot increase, shifting and doubling and the like.

Through internal displacement of the sheet 2 instead of the test-head receiver housing 15, test field blocks 33 of a different composition than those in the basic position can be brought beneath the densitometers 8. This means that, in an additional test step, even more information can be obtained than that described hereinbefore.

There are claimed:

1. Monitoring device for densitometrically evaluating printed sheets with a printed print-monitoring strip, the printed sheets lying in a static position on a test bench outside the printing machine, comprising holding means displaceable in longitudinal and tranverse direction of the test bench, a plurality of first densitometers for exclusively measuring full-tone density carried by said holding means at a selective spacing from one another so as to define respective gaps between said first densitometers, and a plurality of second densitometers for simultaneously measuring at least one tone density value selected from a range of screen and full tone values, said second densitometers being received, respectively, in said gaps between said first densitometers and being connected to a device for mathematically correlating the values measured by said second densitometers with quality-assessing parameters.

2. Monitoring device according to claim 1 including a print-monitoring strip underlying said holding means and having a plurality of test fields of given width consecutively disposed thereon, said holding means together with said first and second densitometers being axially slidable into a plurality of test positions corresponding to said widths of said test fields with respectively equal spacing between said test positions.

3. Monitoring device according to claim 2 wherein the test positions into which said holding means together with said first and second densitometers are slidable are four in number corresponding to the four colors of a four-color printing process.

4. Monitoring device according to claim 3 including a stationary color filter bar associated with and located opposite all of said plurality of first densitometers for exclusively measuring full-tone density, said color filter bar being free of any filters in regions thereof juxtaposed to said gaps between said first densitometers.

5. Monitoring device according to claim 4 including additonal color filters respectively associated with each of said second densitometers.

6. Monitoring device according to claim 5 including guide means, said holding means together with said first and second densitometers being mounted conjointly with said color filter bar and being displaceable therewith as a unit in said guide means and parallel to the leading edge of a printed sheet, and means for releasably fixing said holding means with respect to said guide means.

* * * * *